United States Patent [19]
McMahon et al.

[11] Patent Number: 5,444,402
[45] Date of Patent: Aug. 22, 1995

[54] VARIABLE STRENGTH CLOCK SIGNAL DRIVER AND METHOD OF MANUFACTURING THE SAME

[75] Inventors: Scott H. R. McMahon; James M. Buchanan; Stephen C. Horne, all of Austin, Tex.

[73] Assignee: Advanced Micro Devices, Sunnyvale, Calif.

[21] Appl. No.: 10,930

[22] Filed: Jan. 29, 1993

[51] Int. Cl.$^6$ .................. H03K 5/12; H03K 17/16
[52] U.S. Cl. .................... 327/170; 327/113; 327/379; 326/26
[58] Field of Search .............. 307/263, 270, 271, 443; 327/170, 108, 111, 112, 113, 379, 388, 389; 326/21, 26, 27, 28

[56] References Cited

U.S. PATENT DOCUMENTS

| | | | |
|---|---|---|---|
| 4,291,242 | 9/1981 | Schriber | 307/270 |
| 5,003,205 | 3/1991 | Kohda et al. | 307/443 |
| 5,023,843 | 6/1991 | Love | 365/222 |
| 5,039,874 | 8/1991 | Anderson | 307/263 |
| 5,153,450 | 10/1992 | Ruetz | 307/270 |
| 5,153,457 | 10/1992 | Martin et al. | 307/443 |
| 5,293,082 | 3/1994 | Bathaee | 327/379 |
| 5,315,172 | 5/1994 | Reddy | 327/170 |

FOREIGN PATENT DOCUMENTS

| | | | |
|---|---|---|---|
| 880279715 | 11/1988 | Japan | H03K 19/0175 |
| 890254275 | 9/1989 | Japan | H03K 19/0185 |

Primary Examiner—Timothy P. Callahan
Assistant Examiner—Toan Tran
Attorney, Agent, or Firm—Conley, Rose & Tayon

[57] ABSTRACT

A variable strength clock signal driver circuit and method of manufacturing the same are provided that accommodate either full or reduced drive strength of a generated clock signal. The clock driver circuit includes a package bonding option to select the desired strength of drive. Thus, the clock driver circuit may be operated at either fast or slow clock frequencies as determined by the system requirements. As a result, both high performance, high drive versions and low cost, low drive versions of a digital circuit such as a microprocessor may be provided that differ only in package bonding. The same set of masks may be used to produce either version of the circuit, thus permitting greater manufacturing flexibility and reducing cost. Furthermore, electromagnetic interference may be reduced by selecting the low drive strength option for cost sensitive applications.

10 Claims, 9 Drawing Sheets

VARIABLE STRENGTH CLOCK SIGNAL DRIVER AND METHOD OF MANUFACTURING THE SAME

BACKGROUND OF THE INVENTION

1. Field of the Invention

This invention relates to signal generators and, more particularly, to clock driver circuits that supply clocking signals to other digital circuitry. The invention also relates to the generation of internal microprocessor clock signals and to methods of manufacturing clock driver circuits.

2. Description of the Relevant Art

A clock signal is a periodic waveform whose primary function is to provide timing references for controlling the activities of other digital circuitry. The clock signal is typically provided from a clock driver circuit that is designed to meet the drive requirements of the circuitry during worst case conditions.

The frequency of the clock signal is often an important consideration with respect to the operation of a digital circuit. In general, as the speed of the clock signal increases, the time required for the digital circuitry to perform its designated function decreases. For example, it is well known that microprocessor circuits require one or more internal clock signals to control various subsections of the microprocessor circuitry. In general, as the speed of the internal microprocessor clock increases, the time required to execute a particular program decreases. Thus, microprocessors having relatively high internal clock frequencies are desirable for high performance and computational intensive applications.

On the other hand, as the frequency of the clock signal increases, a stronger clock driver circuit is usually necessary to meet the drive requirements of the digital circuitry to be driven. Stronger clock driver circuits that operate at relatively high frequencies typically consume more power and are often more expensive, both in design and manufacture.

The frequency and edge rate (slew rate) of clock signals can also effect the electromagnetic interference (EMI) generated. Electromagnetic interference is generated by nearly all electrical circuits. The quantity of EMI radiated by a circuit is based upon many factors, including the transient current generated by the clocks and other logic circuits driven by the clocks. In general, the circuits on a semiconductor chip are a source of the transient currents, and the surrounding components such as the device package, the printed circuit board, and the cables attached to the printed circuit board act as antennae that radiate the high frequency components of the transient currents.

The period of a clock signal determines the fundamental frequency of the spectral envelope and the edge rate determines the amplitude of the harmonic components. In the case of an ideal square wave in comparison to an actual waveform, the actual waveform will have reduced high frequency components. Given this, a clock driver that provides clock signals with increased frequency and edge rates will typically be associated with increased EMI.

Chip manufacturers typically control EMI emissions through package design techniques. These techniques include power/ground planes within the package, grounded seal lids, and rails for by-pass capacitors. Systems manufacturers typically use board-level and enclosure techniques including moating in the PC board, separate power-ground planes, chokes, decoupling capacitors, and shielding. Many of these techniques are relatively expensive to employ.

EMI reduction is a rather important feature for manufacturers who would like to comply with FCC Class B and other requirements. Compliance with FCC Class B allows the device to be used in either a residential or a commercial application. Class A is restricted to industrial use only. Thus, a product that conforms to Class B will include a much larger market.

As a result of these tradeoffs of performance, cost, and generated EMI, manufacturers commonly provide several versions of the same type of digital circuit that meet different EMI, power and speed targets; one version that operates at a relatively high speed for high performance or computational-intensive applications, and another version that operates at a lower speed for low EMI, low power, or low cost applications. Such practice is typical within, for example, the microprocessor industry. To provide differing versions of the same microprocessor family, a manufacturer may fabricate a microprocessor with two separate clock generators incorporated on the semiconductor die. One of the clock generators is designed to have a strong drive capability to meet the drive requirements during high frequency operation, and the other is designed to have a weaker drive capability that will only meet the drive requirements during the lower frequency of operation. Metal mask programming methods can be employed during the fabrication of the microprocessor to enable one of the clock generators and disable the other clock generator. Unfortunately, this technique is somewhat expensive since a different set of masks must be used for the different microprocessor versions and, in addition, considerable die space is wasted since one of the clock generators on the semiconductor die is permanently disabled. Furthermore, once the microprocessor chip has been fabricated for use with a crystal oscillator of a predetermined maximum frequency, the internal maximum clock frequency cannot be changed following fabrication.

The microprocessor manufacturer may alternatively employ a fuse link that can be optionally blown open at wafer sort (a test operation that occurs after a semiconductor wafer has been fabricated but prior to dicing the wafer into individual circuits which will then be packaged) to enable one of the clock generators and disable the other. Likewise, a fuse may be blown after the device has been packaged by applying a voltage or current pulse to an external pin or pins on the package housing. Fuse links are a better option than metal masks from the standpoint that they can be configured during wafer sort using performance data; however, they present several other problems. Fuses pose a reliability risk in that they may, over time, repair themselves. Fuses further reduce the reliability of the device since they require openings in the passivation coating of the die. Finally, fuses require that the probe card (provided to electrically connect the semiconductor die to a test system) routinely handle large current transients in order to blow the fuse. This can add cost to the manufacturing of the device since the probe cards may require servicing more often.

SUMMARY OF THE INVENTION

A variable strength clock signal driver and method of manufacturing the same are therefore provided that accommodate either full or reduced drive strength of a generated clock signal. The clock driver circuit includes a package bonding option to select the desired strength of drive. Thus, the clock driver circuit may be operated at either fast or slow clock frequencies as determined by the system requirements. As a result, both high performance, high drive versions and low cost, low drive versions of a digital circuit such as a microprocessor may be provided that differ only in package bonding. The same set of masks may be used to produce either version of the circuit, thus permitting greater manufacturing flexibility and reducing cost. Furthermore, electromagnetic interference may be reduced by selecting the low drive strength option for cost sensitive applications. By reducing the electromagnetic interference generated by the integrated circuit itself, high cost packaging and system level solutions to EMI may become unnecessary.

These and other advantages are achieved with the present invention, in accordance with which a clock signal driver circuit fabricated on an integrated circuit die comprises a first transistor output stage including an output line for providing a clock signal, a low driver unit coupled to drive the first transistor output stage and coupled to receive an input clock timing signal, a second transistor output stage coupled to the output line in parallel with the first transistor output stage, and a high driver unit coupled to drive the second transistor output stage and coupled to receive the input clock timing signal. The high driver unit includes a disable control line for disabling the second transistor output stage in response to a disable signal provided to the disable control line. A bond pad is formed on the integrated circuit die, wherein the disable signal is dependent upon a connection of a bond wire between the bond pad and a connecting pin of the integrated circuit package.

In accordance with another aspect of the present invention, a clock signal driver circuit fabricated on an integrated circuit die to be housed within an integrated circuit package comprises a clock signal output stage including an output line for providing a clock signal, and a means for varying the drive strength of the clock signal output stage in response to a disable signal. The clock signal driver circuit further includes a bond pad formed on the integrated circuit die wherein the disable signal is dependent upon an electrical connection of a bond wire between the bond pad and the integrated circuit package.

In accordance with yet a further aspect of the present invention, a method of manufacturing a clock signal driver circuit that is fabricated on an integrated circuit die and housed within an integrated circuit package is provided. The method comprises the steps of fabricating a clock signal output stage including an output line for providing a clock signal on the integrated circuit die, fabricating a control means on the integrated circuit die for varying the drive strength of the output stage in response to a disable signal, and fabricating a bond pad electrically coupled to the control means on the integrated circuit die. The method further comprises the step of optionally connecting a bond wire between the bond pad and a connecting pin of the integrated circuit package to control the disable signal and thus select the drive strength of the clock signal output stage.

The invention will be more readily understood with reference to the drawings and the detailed description. As will be appreciated by one skilled in the art, the invention is applicable to clock signal driver circuits in general and is not limited to the specific embodiments disclosed.

DETAILED DESCRIPTION

The following includes a detailed description of the best presently contemplated modes for carrying out the invention. The description is intended to be merely illustrative of the invention and should not be taken in a limiting sense.

Figure 1:
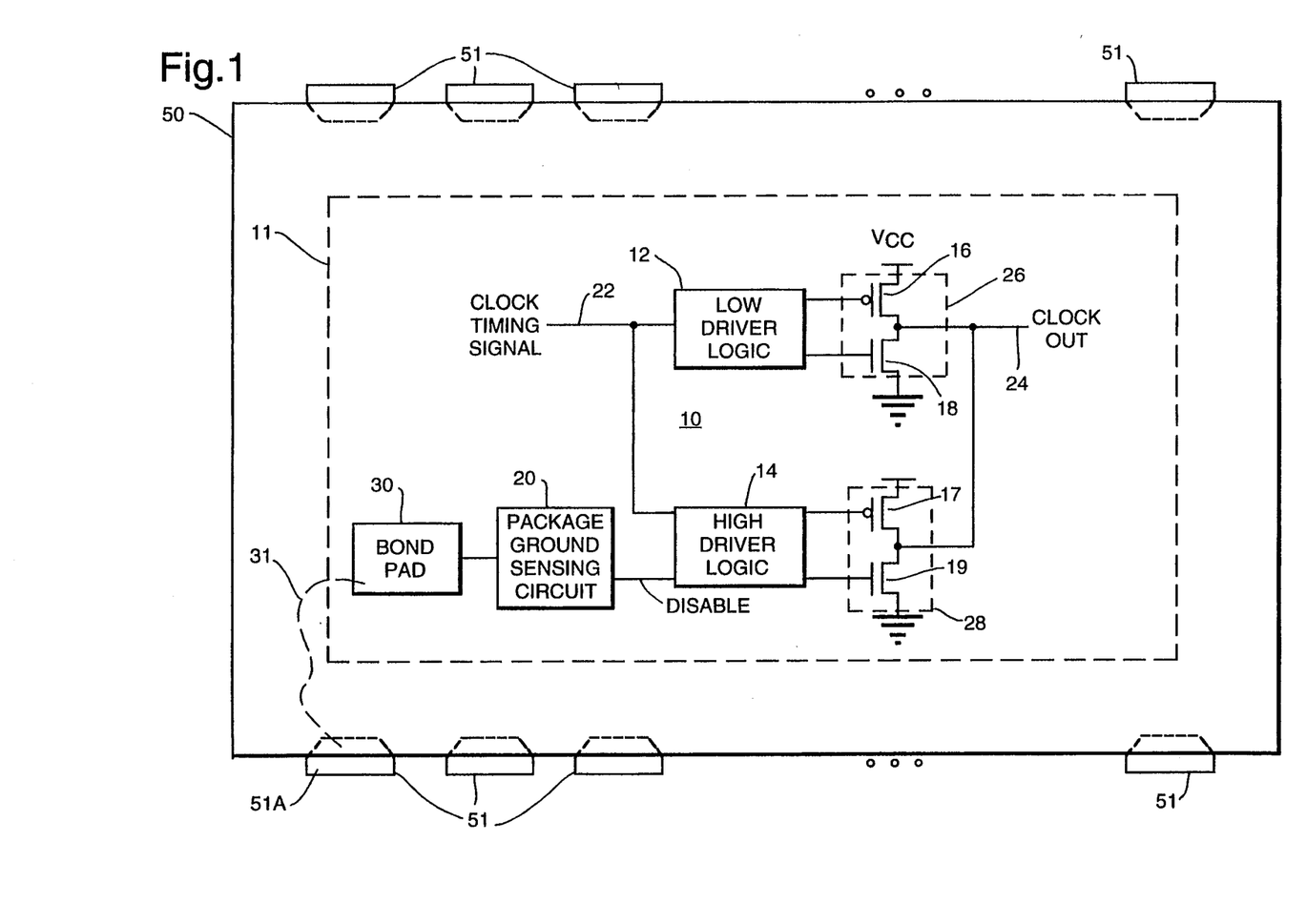
FIG. 1 is a block diagram of a variable strength clock signal driver circuit incorporated on a packaged integrated circuit die. The clock driver circuit includes parallel drivers, one of which can be disabled to reduce the drive strength of the combined circuit.

Referring to FIG. 1, a block diagram is shown of a variable strength clock signal driver circuit 10 fabricated on an integrated circuit die 11. The clock signal driver circuit 10 includes a low driver logic unit 12, a high driver logic unit 14, a pair of P-channel field effect transistors 16 and 17, a pair of N-channel field effect transistors 18 and 19, a package ground sensing circuit 20, and a bond pad 30. A first transistor output stage 26 is formed by transistors 16 and 18, and a second transistor output stage is formed by transistors 17 and 19. The clock signal driver circuit 10 receives an input clock timing signal at a line 22 and provides a clock output signal at a line 24. The clock output signal may be provided to other digital circuitry (not shown) on the integrated circuit die 11 for use as a clock signal.

Following fabrication of the integrated circuit die 11, the die is mounted and housed within an integrated circuit package 50 including a plurality of external contact pins 51. The integrated circuit package 50 may be of a variety of types, including dual in-line packages (DIP) and plastic leaded chip carrier (PLCC) packages. After the integrated circuit die 11 has been mounted within the package 50, appropriate bond wires are connected between various bond pads (31 and others not shown) of the integrated circuit die 11 and the contact pins 51.

When the clock signal driver 10 is employed for use in a high-performance, relatively high frequency environment, both the low driver logic unit 12 and the high driver logic unit 14 are enabled, thereby driving both the transistor output stages 26 and 28. This is achieved by connecting an optional bond wire 31 between the bond pad 30 and a ground pin 51A of package 50. When bond pad 30 is connected to ground pin 51A, the package ground sensing circuit deasserts a signal named DISABLE, providing a low signal which thereby enables the high driver logic unit 14. The transistor output stages 26 and 28 thus effectively operate in parallel, combining their output drive. This combination achieves the necessary edge rates required for high frequency operation.

On the other hand, when the clock signal driver 10 is employed in a cost-sensitive, lower frequency environment, the bond pad 30 is left unconnected and floating. The package ground sensing circuit 20 responsively drives signal DISABLE high to disable the high driver logic unit 14. The transistor output stage 28 thus does not contribute to the output drive current. The net effect is that the edge rates are reduced at the cost of a reduced maximum operating frequency. The reduction in the edge rate reduces the radiated EMI level, and thus cheaper packaging technology may be utilized.

It is noted that the sizes of the transistors 16 and 18 forming output stage 26 are not necessarily equal in size to the transistors 17 and 19 of output stage 28. It is also noted that additional driver logic units and additional transistor output stages could be added in parallel to provide more than two levels of current drive strength. Such variations could be made without departing from the spirit and scope of the invention.

The clock signal driver circuit 10 is thus provided on an integrated circuit that includes a bond pad 30 that may be electrically connected to the package ground sensing circuit 20. The drive strength of the clock signal driver 10 is chosen during the packaging of the integrated circuit die by either connecting the bond wire 31 between the bond pad 30 and package ground, or by leaving the bond pad 30 floating with no package bond wire. As a result, both high performance, high driver versions and low cost, low drive versions of a digital circuit may be provided that differ only in package bonding. The same set of masks may be used to produce either version of the circuit, thus permitting greater manufacturing flexibility and reducing cost.

Figure 2:
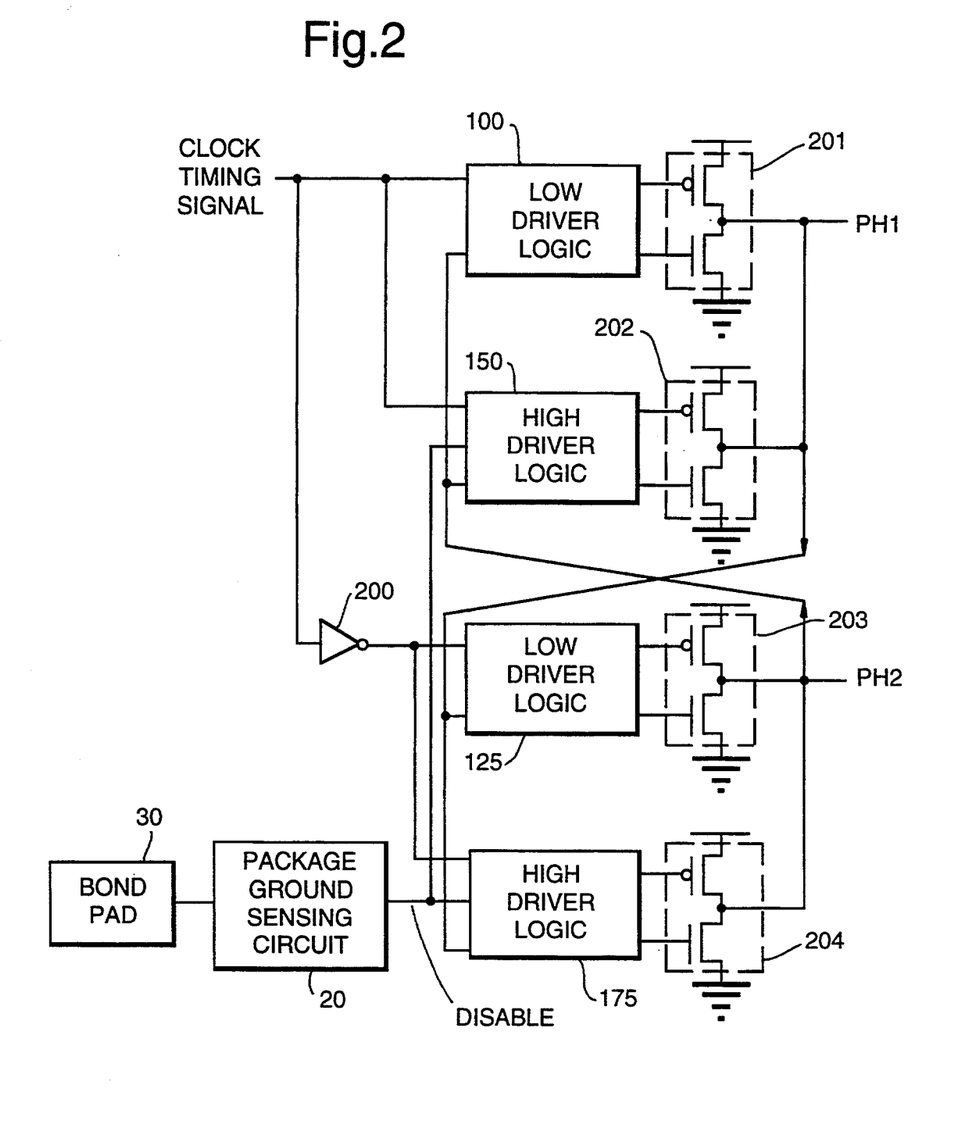
FIG. 2 is a block diagram of a two-phased clock driver circuit for incorporation within a microprocessor.

Referring next to FIG. 2, a block diagram of a second embodiment of a clock signal driver circuit is shown. The circuit of FIG. 2 is similar to that of FIG. 1, and corresponding blocks are numbered identically. The clock driver circuit of FIG. 2 is a two-phased clock circuit for incorporation within a microprocessor. As such, the circuit provides a pair of clock output signals labeled PH1 and PH2 that are 180° out of phase to drive various subsections of the microprocessor. The circuit includes a package ground sensing circuit 20, a bond pad 30, a pair of low driver logic units 100 and 125, and a pair of high driver logic units 150 and 175. The circuit finally includes an inverter 200 and transistor output stages 201-204.

Figure 3:
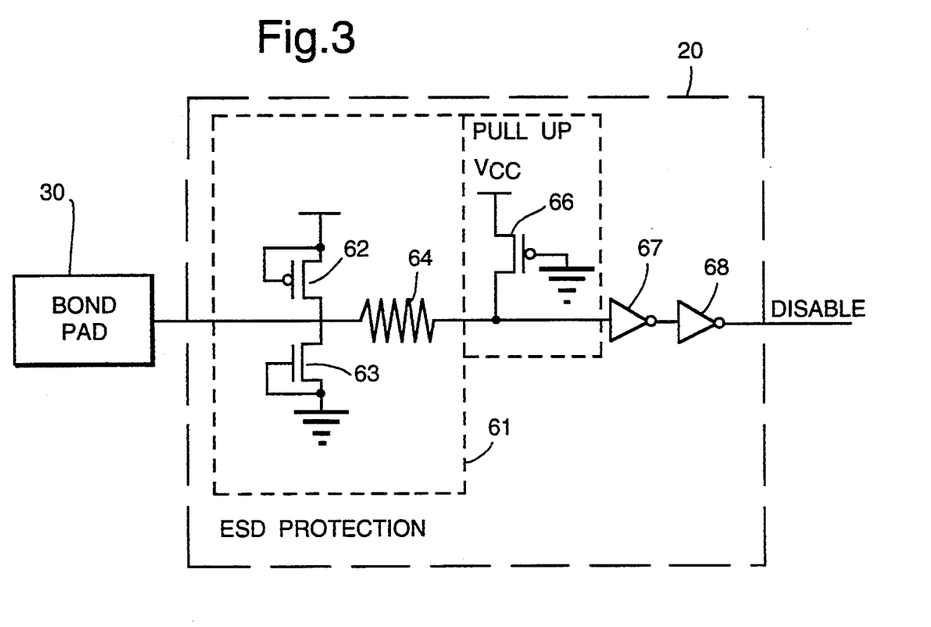
FIG. 3 is a schematic diagram of a package ground sensing circuit.

Exemplary circuitry forming the package ground sensing circuit 20, as well as the low and high driver logic units, is next considered. FIG. 3 is a schematic diagram of a package ground sensing circuit 20. The package ground sensing circuit includes an ESD (electrostatic discharge) protection circuit 61, a pull up transistor 66 (with guard ring for latchup protection not shown but incorporated in the topological artwork or layout of the transistor using commonly known practices and techniques), and a pair of amplification inverters 67 and 68. The ESD protection circuit 61 includes a pair of field effect transistors 62 and 63 and a resistor 64. If the bond pad 30 is floating and is not electrically connected to ground via a bond wire, the pull up transistor 66 will pull the input line of inverter 67 high. An output signal labeled DISABLE from the package ground sensing circuit 20 will therefore go high. If the bond pad 30 is connected to ground via a bond wire, the pull up transistor 66 is too weak to pull the input line of inverter 67 high. The DISABLE signal thus remains low.

Figure 4:
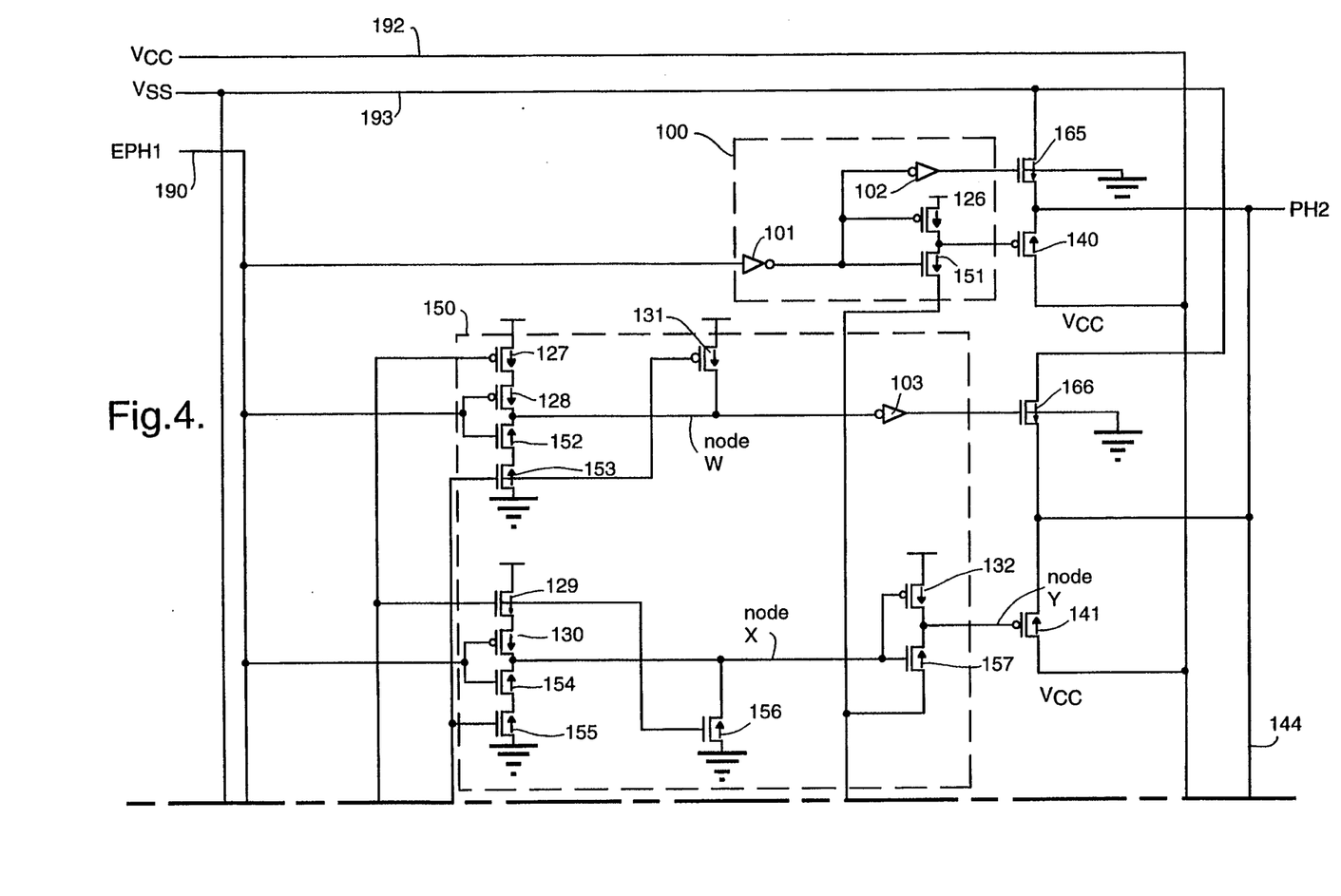
FIG. 4 is a schematic diagram of a first embodiment of a variable strength clock signal driver circuit.

FIG. 4 is a schematic diagram that illustrates low driver logic units 100 and 125 and high driver logic units 150 and 175 coupled to the transistor output stages 201-204. The circuit includes inverters 101-110, P-channel field effect transistors 126-143, and N-channel field effect transistors 151-168. The low driver logic unit 100 is formed by inverters 101 and 102 and transistors 126 and 151. Similarly, the low driver logic unit 125 is formed with inverters 105-106 and transistors 139 and 164. The high driver logic unit 150 is formed with inverter 103 and transistors 127-132 and 152-157. Similarly, high driver logic unit 175 is formed with inverter 104 and transistors 133-138 and 158-163. Transistors 140-143 and 165-168 form four transistor output stages. An input clock timing signal labeled EPH1 is provided at a line 190, and a pair of power supply terminals are provided at lines 192 and 193. In this embodiment, the voltage VCC is more positive than the voltage VSS.

The DISABLE signal from a package ground sensing circuit 20 is received at line 195. The DISABLE signal is provided to either enable or disable the high driver logic units 150 and 175. It is noted that the DISABLE signal does not affect the low driver logic units 100 and 125. When the input clock timing signal EPH1 is high, the output of inverter 101 goes low, thereby turning on (low impedance) transistor 126. Transistor 140 is therefore off (high impedance). The output line of inverter 102 goes high, thereby turning on transistor 165 and driving signal PH2 (at a voltage level of VSS). At the same time, the output line of inverter 105 goes high, thereby turning on transistor 164. This turns on transistor 143, and correspondingly causes signal PH1 to go high. It is evident that the feedback line 144 ensures that transistor 164 does not turn on until signal PH2 has fallen low. This feedback thereby assures that signals PH1 and PH2 do not overlap more than a specified amount.

When signal EPH1 goes low, the output line of inverter 105 also goes low, and the output line of inverter 106 goes high. Transistor 168 thus turns on, driving signal PH1 low. At the same time, the output line of inverter 101 goes high, thereby turning on transistors 151 and 140. Signal PH2 correspondingly goes high.

Control logic within high driver logic units 150 and 175 uses signal DISABLE to inhibit the output stage transistors 141-142 and 166-167 from sourcing current, placing the output stages in a high-impedance state. When the DISABLE signal is high, transistors 127, 153, 129, and 155 are forced off. This prevents the signal EPH1 from toggling nodes W and X. Transistor 131 turns on, thus forcing node W high, and transistor 156 turns on, thus driving node X low. The output of inverter 103 thus goes low, and transistor 166 remains off. Transistor 132 turns on, thereby forcing transistor 141 off. The transistor output stage formed by transistors 141 and 166 is thereby held in a high impedance state.

When the signal DISABLE is low, transistors 127, 129, 153 and 155 turn on, thereby allowing nodes W and X to be toggled in response to the input signal EPH1. That is, when signal EPH1 is high, nodes W and X go low. Similarly, when signal EPH goes low, nodes W and X go high. Thus, when signal EPH1 goes low, transistor 141 turns on, thereby driving signal PH2 high. When signal EPH1 goes high, transistor 166 turns on, thereby driving signal PH2 low. It is noted that the drive current provided by transistors 141 and 166 are supplemental to the drive current provided by transistors 140 and 165, thus increasing the overall drive strength of the clock signal driver.

The driving pull up transistor 141 is thus turned off by inhibiting the clock input signal (EPH1) from toggling node X. This node is forced to a low state, which in turn disables the feedback from the other phase and forces node Y high, which turns off the driving pull up transistor 141. The driving pull down transistor 166 is turned off by inhibiting the input signal EPH1 from toggling the node W. This leaves node W in a high state, which turns off the driving pull down transistor 166. This description detailed the operation of the signal PH2 drivers; the signal PH1 drivers operate in the same way.

Figure 5:
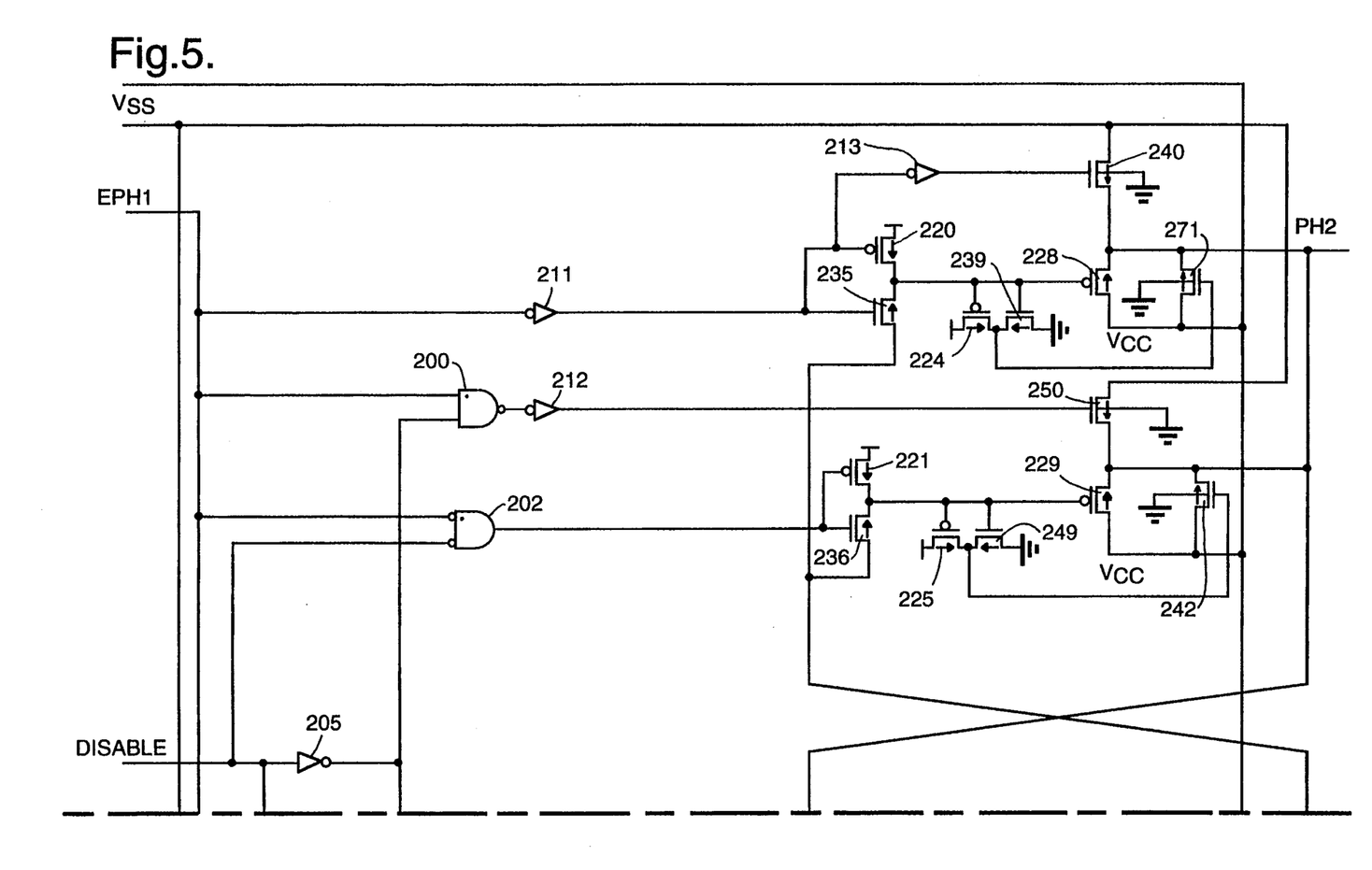
FIG. 5 is a schematic diagram of a second embodiment of a variable strength clock signal driver circuit.
Figure 6:
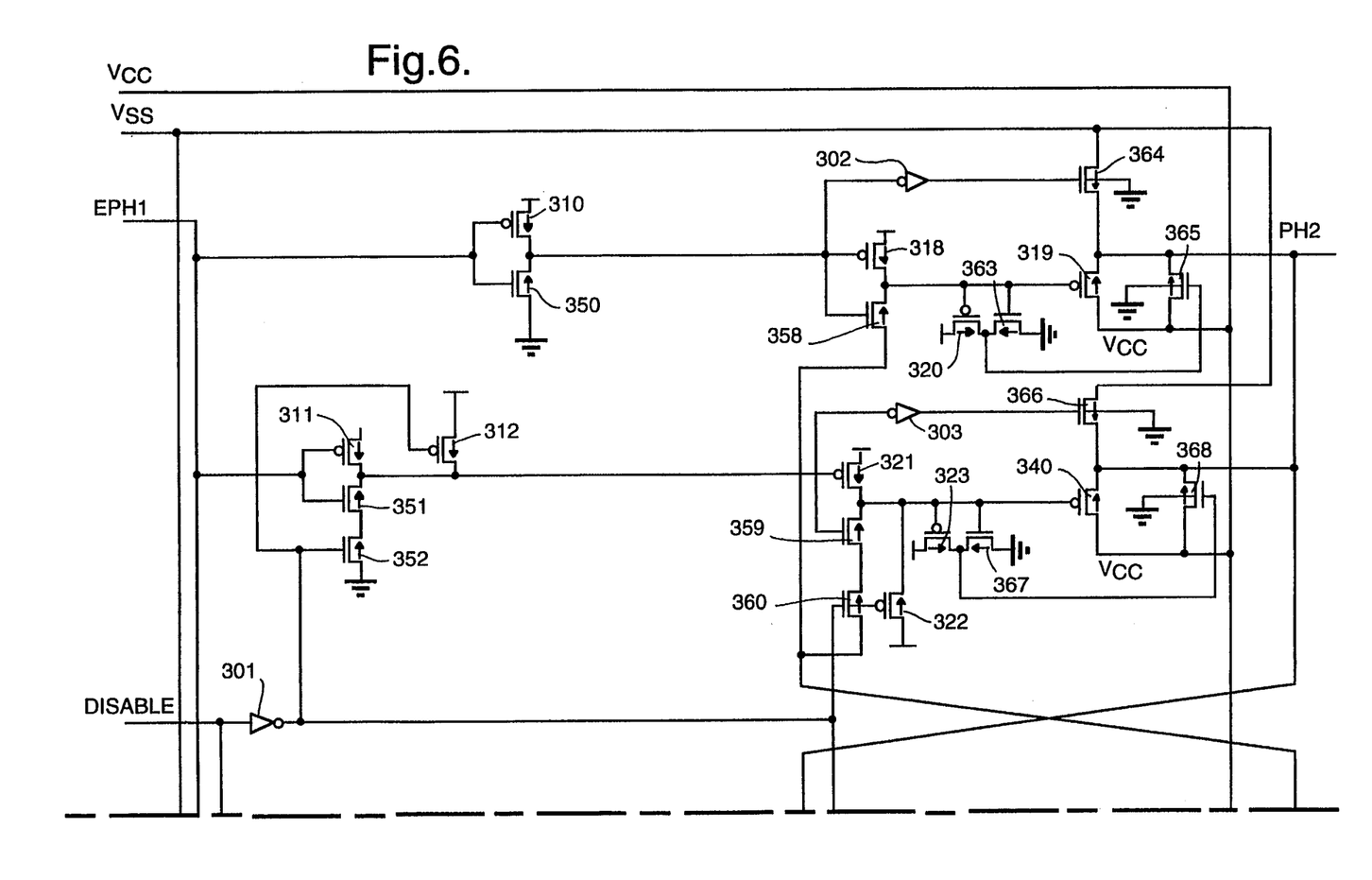
FIG. 6 is a schematic diagram of a third embodiment of a variable strength clock signal driver circuit.

FIGS. 5 and 6 are schematic diagrams illustrating alternative implementations of the clock driver circuit. The circuit of FIG. 5 includes NAND gates 200 and 201, NOR gates 202 and 203, and inverters 205-214. The circuit further includes P-channel field effect transistors 220-231 and N-channel field effect transistors 235-249. It is noted that output transistors 228 and 240 are toggled by signal EPH1 regardless of signal DISABLE. Similarly, output transistors 231 and 247 are also toggled by signal EPH1 regardless of signal DISABLE.

If signal DISABLE is high, the output lines of NOR gates 202 and 203 are low independent of the signal EPH1. Similarly, the output lines of NAND gates 200 and 201 are high independent of the signal EPH1. Therefore, output transistors 229, 230, 245 and 250 remain off or in a high impedance state.

The implementation of the clock driver circuit as illustrated in FIG. 6 includes inverters 301-305, P-channel field effect transistors 310-342, and N-channel field effect transistors 350-374. It is noted that when the signal DISABLE is high, output transistors 340, 341, 366, and 371 are held off or in a high impedance state.

Numerous modifications and variations will become apparent to those skilled in the art once the above disclosure is fully appreciated. For example, a variety of other implementations of the low and high driver logic units are possible, as well as alternative means for varying the drive strength of the output stage. Similarly, additional output stages could be incorporated to provide more than two levels of drive strength. In addition, other implementations of the package ground sensing circuit are possible. The package ground sensing circuit 20 could be eliminated entirely by connecting the bond pad 30 to either a ground pin of the package 50 or to a high voltage reference pin, depending upon the drive requirements. It is to be understood that the above detailed description of the preferred embodiment is intended to be merely illustrative of the spirit and scope of the invention and should not be taken in a limiting sense. The scope of the claimed invention is better defined with reference to the following claims.

What is claimed is:

1. A clock signal driver circuit fabricated on an integrated circuit die to be housed within an integrated circuit package, said clock signal driver circuit comprising:

a first transistor output stage including an output line for providing a clock signal;

a low driver unit coupled to drive said first transistor output stage and coupled to receive an input clock timing signal;

a second transistor output stage coupled to said output line;

a high driver unit coupled to drive said second transistor output stage and coupled to receive said input clock timing signal, wherein said high driver unit includes a disable control line for disabling said second transistor output stage in response to a disable signal provided to said disable control line;

a bond pad formed on said integrated circuit die, wherein said disable signal is in a first state when a bond wire is electrically connected from a connecting pin of said integrated circuit package to said bond pad and wherein said disable signal is in a second state when said bond pad is electrically disconnected from said connecting pin; and a package ground sensing circuit coupled to said bond pad, wherein said package ground sensing circuit senses an electrical potential at said bond pad and generates said disable signal dependent upon said electrical potential, said package ground sensing circuit including a first pull up transistor coupled between said bond pad and a first power supply terminal for driving said disable signal high when said bond pad is electrically disconnected from said connecting pin.

2. The clock signal driver circuit as recited in claim 1 wherein said first transistor output stage comprises:

a pull-up transistor coupled between a first power supply terminal and said output line; and a pull-down transistor coupled between a second power supply terminal and said output line.

3. The clock signal driver circuit as recited in claim 1 wherein said disable signal is low when said bond pad is electrically connected with said bond wire to said connecting pin of said integrated circuit package.

4. The clock signal driver circuit as recited in claim 3 wherein said connecting pin of said integrated circuit package is a ground reference terminal.

5. The clock signal driver circuit as recited in claim 1 wherein said second transistor output stage comprises:

a pull-up transistor coupled between a first power supply terminal and said output line; and a pull-down transistor coupled between a second power supply terminal and said output line;

wherein said high driver unit prevents said pull-up transistor and said pull-down transistor from turning on when said disable signal is asserted.

6. A clock signal driver circuit fabricated on an integrated circuit die to be housed within an integrated circuit package, said clock signal driver circuit comprising:

a first transistor output stage including an output line for providing a clock signal;

a low driver unit coupled to drive said first transistor output stage and coupled to receive an input clock timing signal;

a second transistor output stage coupled to said output line;

a high driver unit coupled to drive said second transistor output stage and coupled to receive said input clock timing signal, wherein said high driver unit includes a disable control line for disabling said second transistor output stage in response to a disable signal provided to said disable control line;

a bond pad formed on said integrated circuit die, wherein said disable signal is dependent upon an electrical connection of a bond wire between said bond pad and a connecting pin of said integrated circuit package: and a package ground sensing circuit coupled to said bond pad, wherein said package ground sensing circuit senses an electrical potential at said bond pad and generates said disable signal dependent upon said electrical potential, said package ground sensing circuit including a first pull up transistor coupled between said bond pad and a first power supply terminal for driving said disable signal high when said bond pad is electrically disconnected from said connecting pin.

7. The clock signal driver circuit as recited in claim 6 wherein said first transistor output stage comprises:

a pull-up transistor coupled between a first power supply terminal and said output line; and a pull-down transistor coupled between a second power supply terminal and said output line.

8. The clock signal driver circuit as recited in claim 6 wherein said disable signal is low when said bond pad is electrically connected with said bond wire to said connecting pin of said integrated circuit package.

9. The clock signal driver circuit as recited in claim 8 wherein said connecting pin of said integrated circuit package is a ground reference terminal.

10. The clock signal driver circuit as recited in claim 6 wherein said second transistor output stage comprises:

a pull-up transistor coupled between a first power supply terminal and said output line; and a pull-down transistor coupled between a second power supply terminal and said output line;

wherein said high driver unit prevents said pull-up transistor and said pull-down transistor from turning on when said disable signal is asserted.

* * * * *

UNITED STATES PATENT AND TRADEMARK OFFICE
CERTIFICATE OF CORRECTION

PATENT NO. : 5,444,402
DATED : Aug. 22, 1995
INVENTOR(S) : McMahon, et al

It is certified that error appears in the above-indentified patent and that said Letters Patent is hereby corrected as shown below:

Claim 3, col. 8, line 39, please delete "-" and leave space.
Claim 6, col. 9, line 5, delete ":" and substitute therefore —;—

Signed and Sealed this

Twenty-sixth Day of March, 1996

Attest:

BRUCE LEHMAN

Attesting Officer

Commissioner of Patents and Trademarks